United States Patent
Li et al.

(10) Patent No.: US 8,865,481 B2
(45) Date of Patent: Oct. 21, 2014

(54) MRAM DEVICE AND INTEGRATION TECHNIQUES COMPATIBLE WITH LOGIC INTEGRATION

(71) Applicant: QUALCOMM Incorporated, San Diego, CA (US)

(72) Inventors: Xia Li, San Diego, CA (US); Xiaochun Zhu, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/172,208

(22) Filed: Feb. 4, 2014

(65) Prior Publication Data

US 2014/0147941 A1 May 29, 2014

Related U.S. Application Data

(62) Division of application No. 12/850,860, filed on Aug. 5, 2010, now Pat. No. 8,674,465.

(51) Int. Cl.
| | | |
|---|---|---|
| *H01L 29/82* | (2006.01) | |
| *B82Y 10/00* | (2011.01) | |
| *H01L 43/08* | (2006.01) | |
| *H01L 43/12* | (2006.01) | |
| *H01L 27/22* | (2006.01) | |

(52) U.S. Cl.
CPC ................. *H01L 43/12* (2013.01); *B82Y 10/00* (2013.01); *H01L 27/228* (2013.01); *H01L 43/08* (2013.01)
USPC ............... 438/3; 257/421; 257/422; 257/423; 257/427; 257/E29.323; 360/324.2; 360/326; 365/157; 365/158

(58) Field of Classification Search
USPC ...................... 257/421–427, E29.323; 438/3; 365/157–158; 360/324–326
See application file for complete search history.

(56) References Cited

U.S. PATENT DOCUMENTS

| | | | |
|---|---|---|---|
| 6,660,568 B1 | 12/2003 | Gaidis | |
| 6,784,091 B1 * | 8/2004 | Nuetzel et al. | 438/618 |

(Continued)

FOREIGN PATENT DOCUMENTS

| | | |
|---|---|---|
| JP | 2002368197 A | 12/2002 |
| JP | 2004158841 A | 6/2004 |

(Continued)

OTHER PUBLICATIONS

International Preliminary Report on Patentability—PCT/US2011/046811, The International Bureau of WIPO—Geneva, Switzerland, Nov. 29, 2012.
International Search Report and Written Opinion—PCT/US2011/046811—ISA/EPO—Feb. 7, 2012.

*Primary Examiner* — Jami M Valentine
(74) *Attorney, Agent, or Firm* — Sam Talpalatsky; Nicholas J. Pauley; Joseph Agusta

(57) ABSTRACT

A semiconductor device includes a magnetic tunnel junction (MTJ) storage element configured to be disposed in a common interlayer metal dielectric (IMD) layer with a logic element. Cap layers separate the common IMD layer from a top and bottom IMD layer. Top and bottom electrodes are coupled to the MTJ storage element. Metal connections to the electrodes are formed in the top and bottom IMD layers respectively through vias in the separating cap layers. Alternatively, the separating cap layers are recessed and the bottom electrodes are embedded, such that direct contact to metal connections in the bottom IMD layer is established. Metal connections to the top electrode in the common IMD layer are enabled by isolating the metal connections from the MTJ storage elements with metal islands and isolating caps.

20 Claims, 8 Drawing Sheets

(56) References Cited

U.S. PATENT DOCUMENTS

| | | |
|---|---|---|
| 7,579,197 B1 | 8/2009 | Li |
| 8,564,079 B2 | 10/2013 | Kang et al. |
| 2003/0073251 A1 | 4/2003 | Ning |
| 2004/0021188 A1 | 2/2004 | Low et al. |
| 2005/0277206 A1 | 12/2005 | Gaidis et al. |
| 2009/0194832 A1 | 8/2009 | Li |
| 2009/0294881 A1 | 12/2009 | Murata et al. |
| 2012/0032287 A1 | 2/2012 | Li et al. |

FOREIGN PATENT DOCUMENTS

| | | |
|---|---|---|
| JP | 20070165505 | 6/2007 |
| JP | 2009081390 A | 4/2009 |
| JP | 2009290073 A | 12/2009 |
| WO | 2009131944 A1 | 10/2009 |

\* cited by examiner

MRAM DEVICE AND INTEGRATION TECHNIQUES COMPATIBLE WITH LOGIC INTEGRATION

CLAIM OF PRIORITY UNDER 35 U.S.C. §120

The present application for patent is a divisional of patent application Ser. No. 12/850,860 entitled "MRAM DEVICE AND INTEGRATION TECHNIQUES COMPATIBLE WITH LOGIC INTEGRATION" filed Aug. 5, 2010, pending, and assigned to the assignee hereof and hereby expressly incorporated by reference herein in its entirety.

FIELD OF DISCLOSURE

Disclosed embodiments are directed to a Magnetoresistive Random Access Memory (MRAM) cell. More particularly, exemplary embodiments are directed to a magnetic tunnel junction (MTJ) storage element and to methods of integrating the same with logic integration of the MRAM cell.

BACKGROUND

Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

FIG. 1 illustrates a conventional STT-MRAM bit cell 100. The STT-MRAM bit cell 100 includes magnetic tunnel junction (MTJ) storage element 105 (also referred to as "MTJ stack"), a transistor 101, a bit line 102 and a word line 103. The MTJ stack is formed, for example, from a pinned layer 124 and a free layer 120, each of which can hold a magnetic moment or polarization, separated by an insulating tunneling barrier layer 122. There is conventionally an anti-ferromagnetic (AFM) layer and a cap layer (not shown) in the MTJ stack. The AFM layer is used to pin the magnetic moment of the pinned layer. The cap layer is used as a buffer layer between the MTJ and metal interconnects. The polarization of the free layer can be reversed by applying current in a specific direction such that the polarity of the pinned layer and the free layer are either substantially aligned or opposite. The resistance of the electrical path through the MTJ varies depending on the alignment of the polarizations of the pinned and free layers. This variation in resistance can be used to program and read the bit cell 100, as is known. The STT-MRAM bit cell 100 also includes a source line 104, a sense amplifier 108, read/write circuitry 106 and a bit line reference 107. Those skilled in the art will appreciate the operation and construction of the memory cell 100 as known in the art.

MRAM cells are commonly integrated with various other logic gates and electronic components such as transistors, capacitors, metal wires, etc., in the development of memory devices. Accordingly, it is desirable that the process of manufacturing MTJ elements remains compatible with the constraints inherent to manufacture of integrated circuits. However, it is well known that semiconductor technology scaling is not uniform across all components involved in the manufacture of integrated circuits. For example, metal wire width and sizes of Vertical Interconnect Access (commonly known as "via") are scale by about 70% from one generation to the next. However, interlayer metal dielectric (IMD) thickness scaling is much smaller than 70% because diffusion cap layers cannot scale that fast. Therefore, the capacitors scale down at a much slower rate. More particularly, scaling down of height of MTJ cells is even slower and in comparison to other electronic components in integrated circuits, the scaling is almost non-existent in the current state of the art.

The disproportionate rate of scaling in different components gives rise to various challenges in the design and manufacture of integrated circuits. With regard to circuits involving the use of MRAM cells, there are numerous problems associated with integration of rapidly shrinking electronic components with relatively unchanging MRAM sizes. For purposes of this discussion, electronic components such as transistors, metal wires, capacitors, vias, etc, which are not a part of the MRAM cell are generally referred to as "logic elements"; and the process of their integration is referred to as "logic process". The integration process of MRAM elements is generally referred to as "MRAM process". It is desirable for the MRAM process to be compatible with the related logic process. Therefore, it would be beneficial to embed the MRAM process into the logic process flow.

A cross-sectional view of a memory device including at least one MRAM cell is illustrated in FIG. 2. Elements of a particular device layer "x", the layer below, "x−1", and the layer above, "x+1", are shown. Both logic elements and MRAM components are illustrated in juxtaposition. The logic elements are generally represented by metal wires M'x/Mx and M'x−1/Mx−1 in layers x, and x−1 respectively; via V'x in layer x; insulating layers Cap1x and Cap2x in layer x, and Cap1x+1 and Cap2x+1 in layer x+1. The MRAM components comprise an MTJ stack (such as MTJ105) formed between top electrode (TE) and bottom electrode (BE); metal wires Mx and Mx−1 (constituting, for example, bit line 102 and source line 104) in layers x and x−1 respectively; inter-metal-dielectric layers IMDx and IMDx−1; via Vx in layer x; and insulating layers Cap1x and Cap2x in layer x, and Cap1x+1 and Cap2x+1 in layer x+1. The insulating cap layers are used as a diffusion barrier layer for the metal wires. The various cap layers may be formed from known insulators, for example, from materials such as SiC, SiN film, and the like. Further, it will be appreciated that conventional materials and processing techniques can be used for the various logic, metal, and IMD elements discussed herein.

With continuing reference to FIG. 2, L2 represents the height of the MRAM cell including the bottom electrode BE. MTJ stack, and top electrode TE. In general, the vertical distance between metal wires in adjacent layers is the maximum space available for forming the MRAM cell. Accordingly, the MRAM cell in layer x must be contained within metal wires Mx and Mx−1. However, as shown in FIG. 2, this available vertical space is also shared by elements such as vias, insulating layers, and common IMD layer. Accounting for the vertical space consumed by these elements, L1 represents the effective vertical space between the metal layers that is available for the MRAM cell. Trends in technology scaling reveal that the vertical space between layers is rapidly shrinking. However, as previously noted, the thickness of cap layer is not scaling down at the same rate and the scaling rate is slower. Further, as illustrated, a bi-layer insulating structure may be utilized in order to balance mechanical stress introduced by the bottom electrode BE, imposing further restrictions on the available space.

As a result, the available vertical space for formation of the MRAM cell, L1, is less than the actual height, L2, of the MRAM cell. Therefore there is an overlap where the MRAM cell intrudes into the metal wire Mx, as shown. The intrusion creates several problems. Firstly, the danger of a short-circuit is created between the metal Mx and the sidewalls and/or the tunneling barrier layer of the MTJ stack. The issue may be exacerbated in devices with a high density of MRAM cells, because the thin IMD filling between multiple MRAM cells may be insufficient to protect the sidewalls of the cells during etching and metallization processes. Moreover, the introduction of bi-layer insulating caps elevates the vertical position of the MTJ element, thereby increasing the intrusion with metal Mx.

SUMMARY

Generally, MRAM height is not amenable to further scaling down. Accordingly, the thickness of metal wire Mx needs to be reduced and the metal pattern should be smaller than top electrode TE, in order to avoid the intrusion. Because top electrode TE is a conductor layer, thinning of the metal wire above the MTJ element is not disadvantageous, as it acts as a local connection. Additionally, metal wire recesses between MTJ cells may cause short circuits between the metal wires if the IMD fill has defects such as seams. Accordingly, there is a need in the art for techniques and apparatuses where MRAM cells may be integrated in memory devices in a manner compatible with the logic formation processes.

Exemplary embodiments are directed to apparatuses and methods for improving layouts of MRAM cells and integration with the logic in a common layer.

For example, an exemplary embodiment includes a semiconductor device comprising a magnetic tunnel junction (MTJ) storage element configured to be disposed in a common interlayer metal dielectric (IMD) layer with a logic element and a reduced thickness metal wire in the common IMD layer coupled to the MTJ storage element that is smaller in thickness then a corresponding metal wire of the logic element.

Another embodiment can include a method of forming a semiconductor device comprising: forming a magnetic tunnel junction (MTJ) storage element in a common interlayer metal dielectric (IMD) layer with a logic element; and forming a reduced thickness metal wire in the common IMD layer coupled to the MTJ storage element that is smaller in thickness then a corresponding metal wire of the logic element.

Another embodiment can include a semiconductor device comprising: a magnetic tunnel junction (MTJ) storage means formed in a interlayer metal dielectric (IMD) layer with a logic means; and a reduced thickness means for conducting in the common IMD layer coupled to the MTJ storage means that is smaller in thickness then a corresponding conducting means of the logic means.

Another embodiment can include a method of forming a semiconductor device comprising: a step for forming a magnetic tunnel junction (MTJ) storage element in a common interlayer metal dielectric (IMD) layer with a logic element; and a step for forming a reduced thickness metal wire in the common IMD layer coupled to the MTJ storage element that is smaller in thickness then a corresponding metal wire of the logic element.

Another embodiment can include a method of forming a semiconductor device comprising a magnetic tunnel junction (MTJ) storage element disposed in a common interlayer metal dielectric (IMD) layer with a logic element, the method comprising: depositing an MTJ storage element comprising a pinned layer, a tunneling barrier layer and a free layer on a bottom electrode in the common IMD layer; patterning the MTJ storage element; depositing a sidewall cap layer on sidewalls of the MTJ storage element; depositing a top electrode on the MTJ storage element; patterning the top electrode and the bottom electrode; depositing a portion of the common IMD layer, depositing a second metal wire on the top electrode; patterning the second metal wire to form a metal island that is smaller than the top electrode; depositing another portion of the common IMD layer; depositing a second cap layer on the common IMD layer to separate the common IMD layer from a top IMD layer; and forming a third metal wire in the top IMD layer, wherein the third metal wire is coupled to the second metal wire.

Another embodiment can include a method of forming a semiconductor device comprising a magnetic tunnel junction (MTJ) storage element disposed in a common interlayer metal dielectric (IMD) layer with a logic element, the method comprising: forming a first cap layer comprising a first portion and a second portion; patterning the second portion to form an opening for a bottom electrode; depositing the bottom electrode, such that the bottom electrode is in contact with a first metal wire in the first portion; depositing an MTJ storage element on the bottom electrode; depositing a sidewall cap layer on sidewalls of the MTJ storage element: depositing a top electrode on the MTJ storage element; depositing a second metal wire on the top electrode, wherein the second metal wire has reduced thickness in comparison to a corresponding metal wire of the logic element: depositing at least part of the common IMD layer; and depositing a second cap layer on the common IMD layer to separate the common IMD layer from a top IMD layer.

BRIEF DESCRIPTION OF THE DRAWINGS

The accompanying drawings are presented to aid in the description of embodiments of the various embodiments and are provided solely for illustration of the embodiments and not limitation thereof.

DETAILED DESCRIPTION

Aspects of the various embodiments are disclosed in the following description and related drawings directed to specific embodiments. Alternate embodiments may be devised without departing from the scope of the invention. Additionally, well-known elements of the various embodiments will not be described in detail or will be omitted so as not to obscure the relevant details of the various embodiments.

The word "exemplary" is used herein to mean "serving as an example, instance, or illustration." Any embodiment described herein as "exemplary" is not necessarily to be construed as preferred or advantageous over other embodiments.

Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be appreciated that with conventional techniques, it is difficult to integrate the process of forming MRAM cells in a manner that is compatible with the logic process in semiconductor integrated circuits. Exemplary embodiments beneficially avoid the problem of MTJ cells substantially intruding into metal wires by providing a reduced thickness metal wire in the common IMD layer coupled to the MTJ, thereby providing for relatively easy integration of MRAM cells with logic elements.

Figure 1:
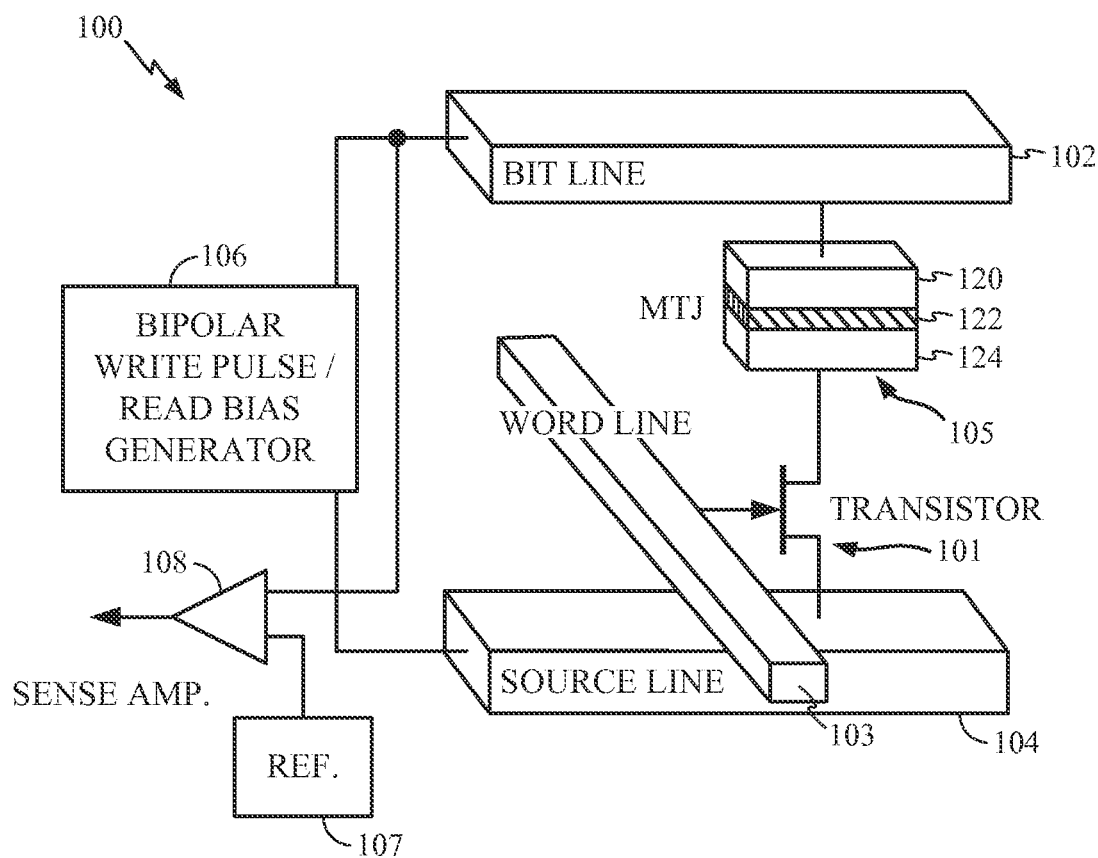
FIG. 1 is an illustration of a conventional MRAM circuit with an MTJ storage element.
Figure 2:
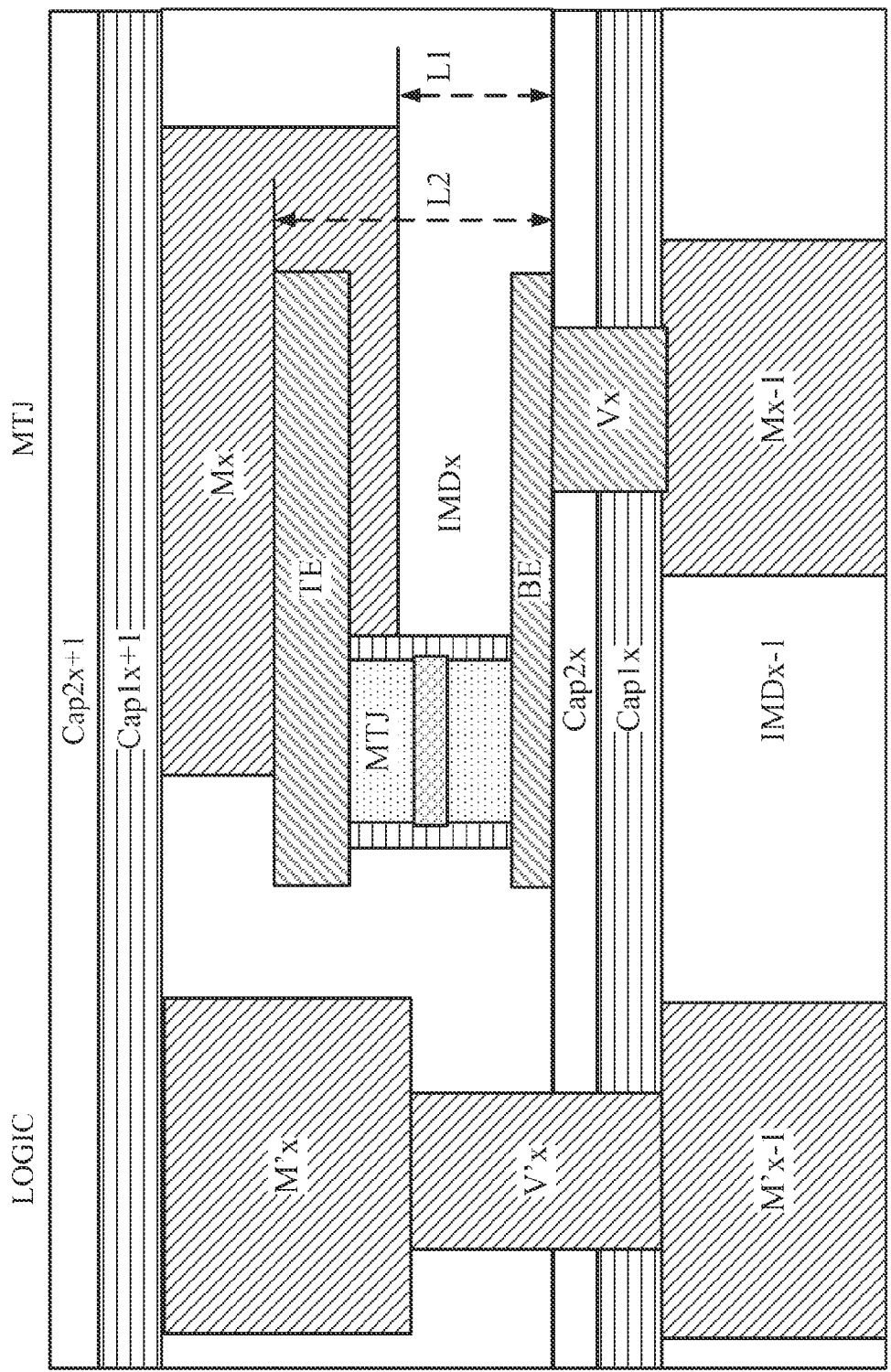
FIG. 2 is a cross-sectional view of a conventional memory device comprising logic elements and MRAM cells.
Figure 3:
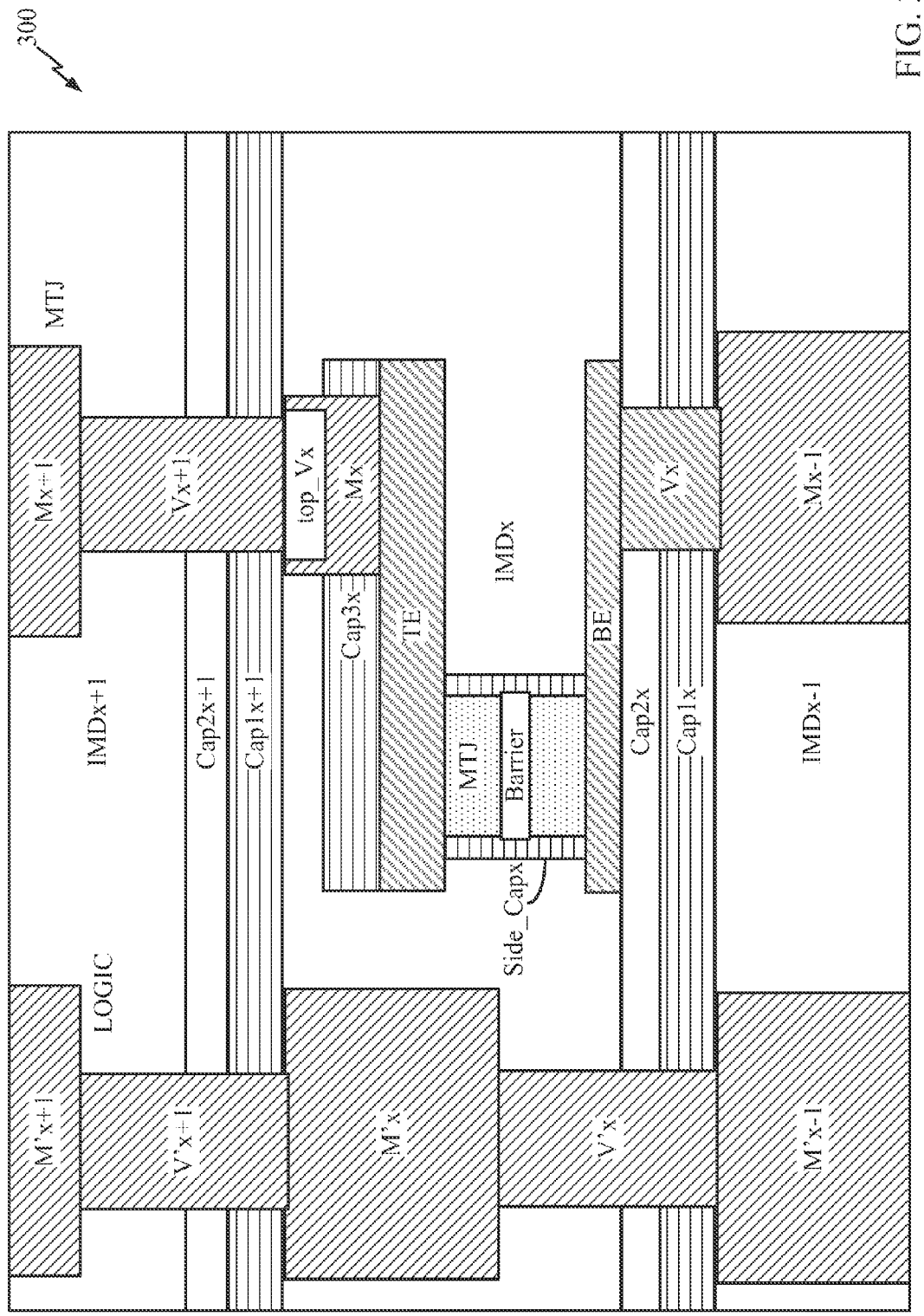
FIG. 3 is a cross-sectional view of an exemplary embodiment including MRAM cells integrated with logic.

FIG. 3 illustrates an exemplary embodiment 300. The spacing between bottom cap layer (Cap1x and Cap2x) and top cap layer (Cap1x+1 and Cap2x+1) is maintained as in the conventional configuration. The portions elements below the bottom cap layer (IMDx−1 and Mx−1) are also similar to the conventional configuration. To maintain the spacing, a two prong solution is provided to alleviate the problems of insufficient space in IMD layer x for MRAM cells and metal wire Mx.

First, the metal wire Mx is isolated from the MTJ cell by confining the metal wire Mx to an island adjacent top electrode TE and surrounded by an optional insulator, Cap3x. This configuration improves etch margin and reduces the short circuit danger. Further, the sidewalls of the MTJ stack may also be encapsulated in an insulating layer, Side_Capx, to provide additional insulation to the layers of the MTJ stack.

Second, the size of metal wire Mx is reduced, both in thickness (vertical dimension) and area (which allows confinement to the metal island). The reduced thickness allows vertical room for forming the MRAM cell without a recession of metal wire Mx into the other layers. However, since the overall metal cross-sectional area is reduced, metal wire Mx (i.e. the bit line) may not be capable of supporting the current density required for proper functioning of the MRAM cell. Therefore, the bit line can be formed from a metal connection in layer x+1. A top via top_Vx can connect metal Mx to via Vx+1. Metal wire Mx+1 (illustrated with partial thickness) may be coupled to via Vx+1. Metal Mx+1 can then be use as the new bit line having appropriate dimensions for supporting the bit line current density. As a result, the direction of current flow changes from horizontal to vertical in metal wire Mx, and the cross-sectional area of Mx can be configured to be sufficient to support the current density used for normal operation of the MRAM cell. For consistency of illustration, the various "logic" elements are M'X−1, V'x, M'x, V'x+1 and M'x+1 are illustrated. Further, it will be appreciated from the juxtaposition of logic elements M'x−1, V'x, M'x, V'x+1 and M'x+1 that the exemplary embodiments successfully integrate MRAM cells that are fully compatible with the logic formation process.

Figure 4A:
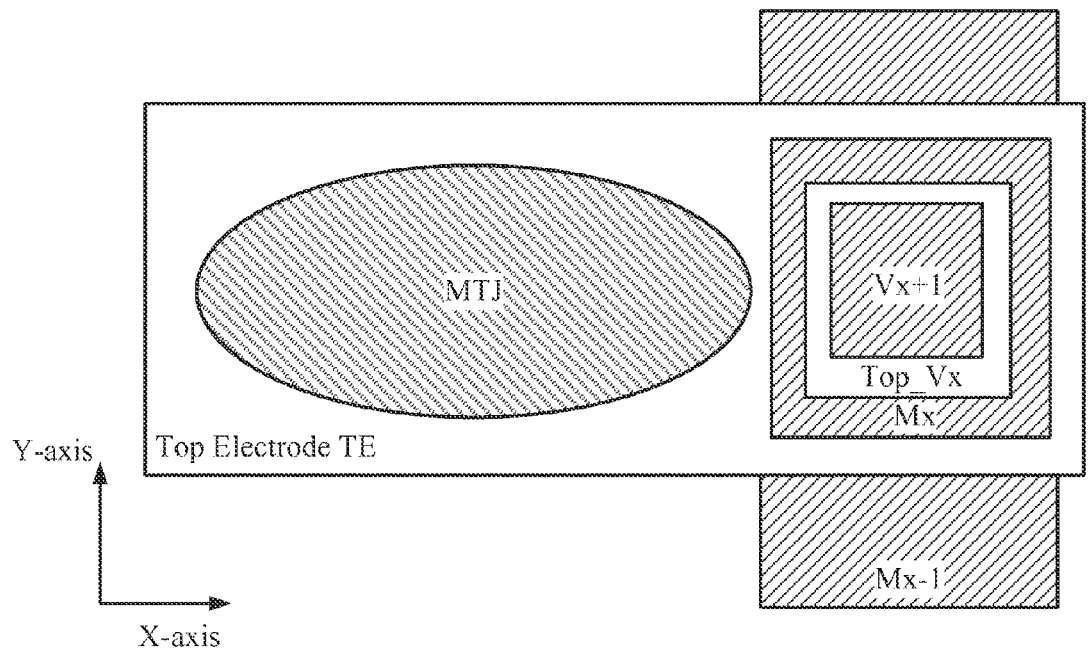
FIGS. 4A and 4B illustrate top views of two orientations of MTJ cells according to an exemplary embodiment.
Figure 4B:
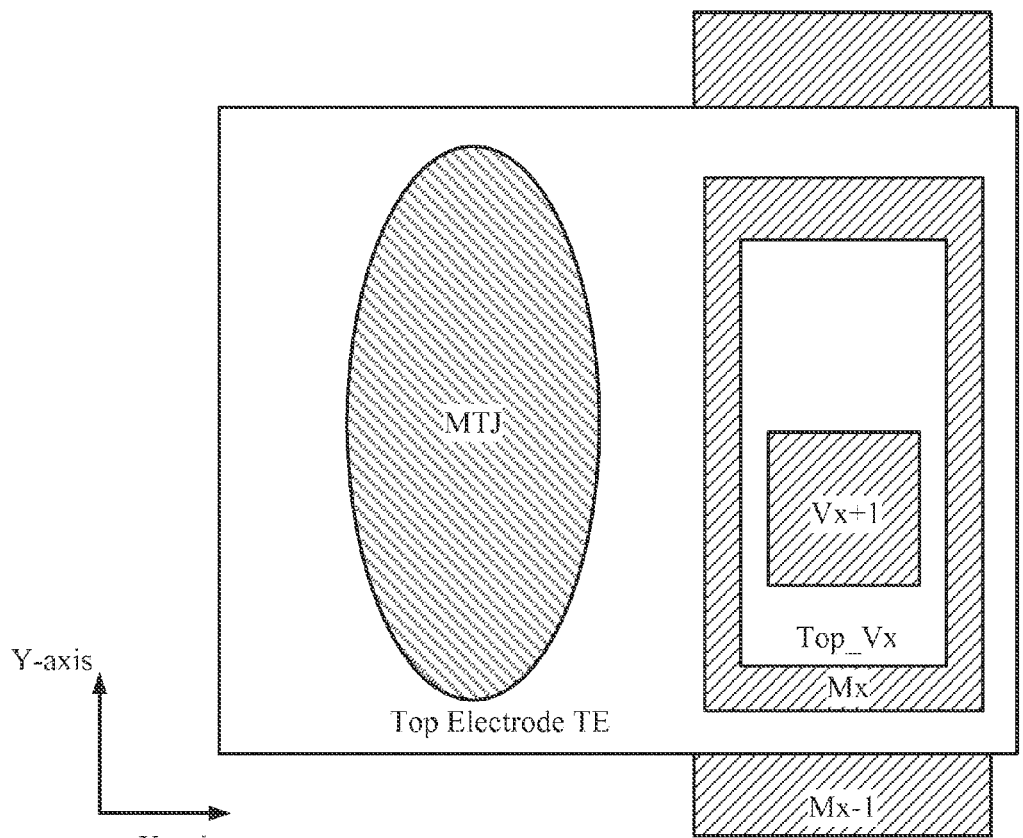

FIGS. 4A-B illustrate schematic top views of two orientations of the MTJ stack according to the embodiment 300. In each of FIGS. 4A and 4B, metal wire Mx+1 (not shown) can be generally oriented in the direction of the Y-axis (similar to Mx−1). In FIG. 4A, the MTJ stack is oriented in the X-axis, substantially perpendicular to the direction of Mx+1 and Mx−1. FIG. 4B illustrates an orientation of the MTJ stack in the Y-axis, substantially parallel to of Mx+1 and Mx−1. In both cases, the top electrode TE is formed to confine metal wire Mx to an island, such that metal wire Mx is isolated from the MTJ stack. Additionally, it will be appreciated that the orientation of the MTJ stack may be chosen to be any angle that lies between substantially parallel and substantially perpendicular, such as a 45 degree angle or other acute angle, for example. Flexibility in choosing various angles of orientation of the MTJ stack based on layout dimensions can provide a reduction in field disturbance that is created by current flowing through the metal wires.

Figure 5:
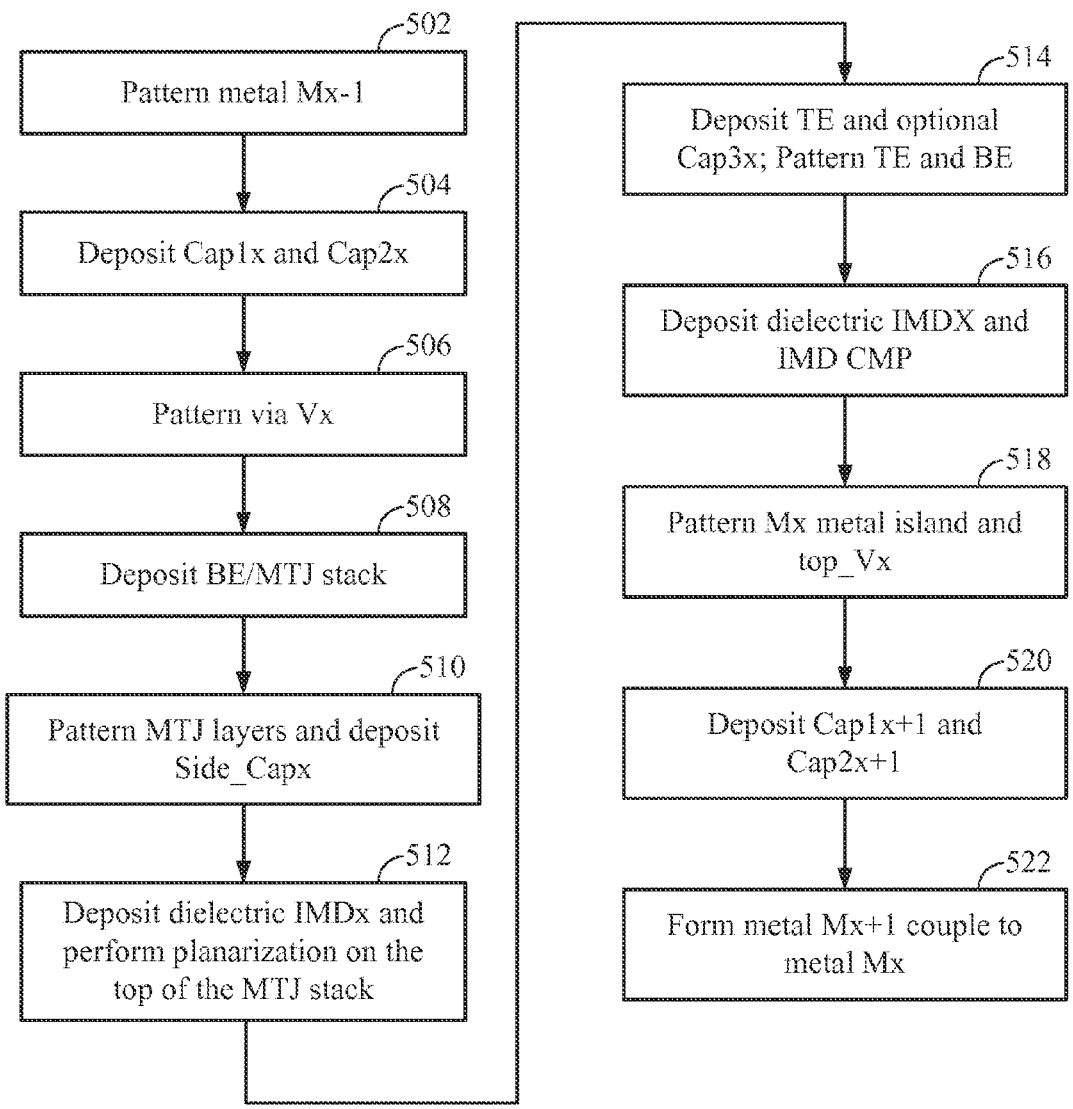
FIG. 5 details the process flow in forming a memory device including MRAM cells according to an exemplary embodiment.

FIG. 5 illustrates a flowchart detailing the process of integrating the MRAM device according to embodiment 300. At block 502, the metal wire Mx−1 in IMD layer x−1 is patterned. Insulating cap layers Cap1x and Cap2x in layer x can be deposited next, in block 504. The cap layers Cap1x and Cap2x are patterned, in block 506, in order to form via Vx, which is deposited. Next, the bottom electrode BE, is deposited on the cap layers (Cap1x and Cap2x) and via Vx, in block 508, along with the deposition of the MTJ stack. The MTJ stack may comprise the various elements, e.g., pinned layer, tunneling barrier layer, free layer, anti-ferromagnetic (AFM) layer and cap layer, as is known in the art. Next, the MTJ stack is patterned and a sidewall cap layer (Side_Capx) is deposited in block 510. Inter-metal-dielectric IMDx is deposited in the regions between MRAM cells and other logic cells in layer x, at block 512. The top of the MTJ stack is subjected to a planarization process (e.g., Chemical Mechanical Polishing (CMP)). Top electrode TE and optional insulating layer Cap3x are deposited in block 514, and the top electrode TE and bottom electrode BE are patterned. Next, in block 516, dielectric IMDx is deposited again, in order to fill open regions of layer x. IMD CMP process can be used for the planarization of IMDx layer. Top via top_Vx and metal Mx can then be patterned and deposited in block 518 to form the top via and metal wire Mx, which forms a metal island, as discussed herein. Cap1x+1, Cap2x+1, and IMDx+1 are deposited in block 520, and patterned to form via Vx+1. Finally, in block 522 metal Mx+1 formed and coupled to metal Mx through vias top_Vx and Vx+1. It will be appreciated that the foregoing process sequences were described solely for illustration and not limitation of the various embodiments. Various sequences may be combined and/or the order rearranged to achieve the configurations illustrated and discussed in relation to FIGS. 3, 4A and 4B. Further, the corresponding operations for forming the logic elements have not been described, as they are well known in the art, and any compatible process may be used.

Figure 6:
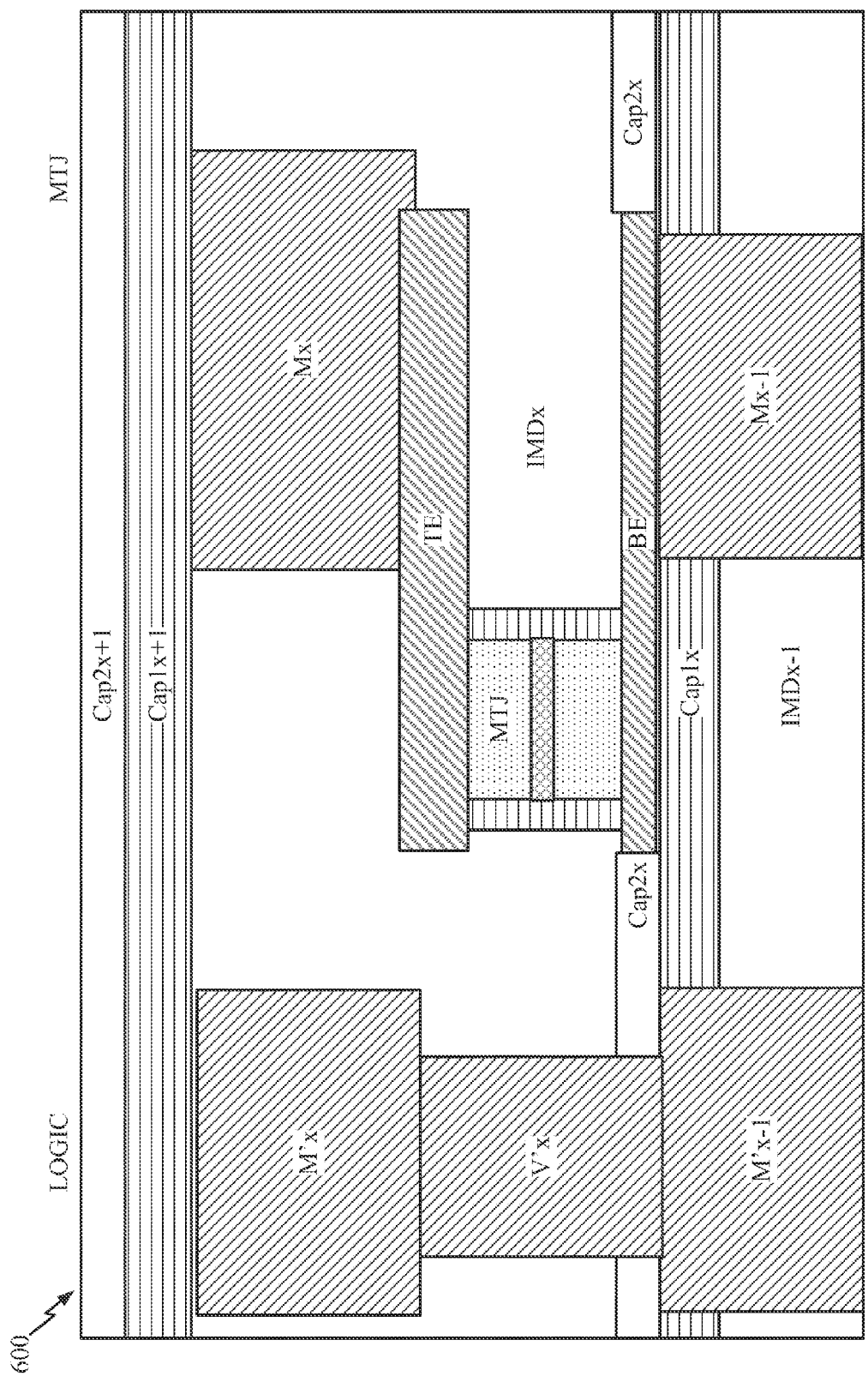
FIG. 6 illustrates another exemplary embodiment including MRAM cells integrated with logic.

FIG. 6 illustrates another exemplary embodiment, 600. The overlap problem is avoided in this embodiment by lowering the position of the MRAM cell in layer cap2x. This is accomplished by excluding the use of Via Vx to connect bottom electrode BE to metal wire Mx−1, and forming BE directly on top of metal Mx−1. The positions of cap layers Cap1x and Cap2x are altered. Cap1x is now formed around Mx−1, and bottom electrode BE is embedded in Cap2x, as shown. Thus, in comparison to conventional designs, the position of the MRAM cell is lowered by approximately the thickness of the two cap layers Cap1x and Cap2x. Metal wire Mx can be used as the bit line and can be formed on top of the top electrode TE. As depicted, there may be minimal thinning or recessing of Mx (in the vertical direction). However, generally the thinning will not have a significant impact on performance of the device. Moreover, the metal wire Mx is well isolated by top electrode TE, from the sidewalls and tunneling barrier layer. Accordingly, the danger of a short-circuit taking place is avoided.

Figure 7:
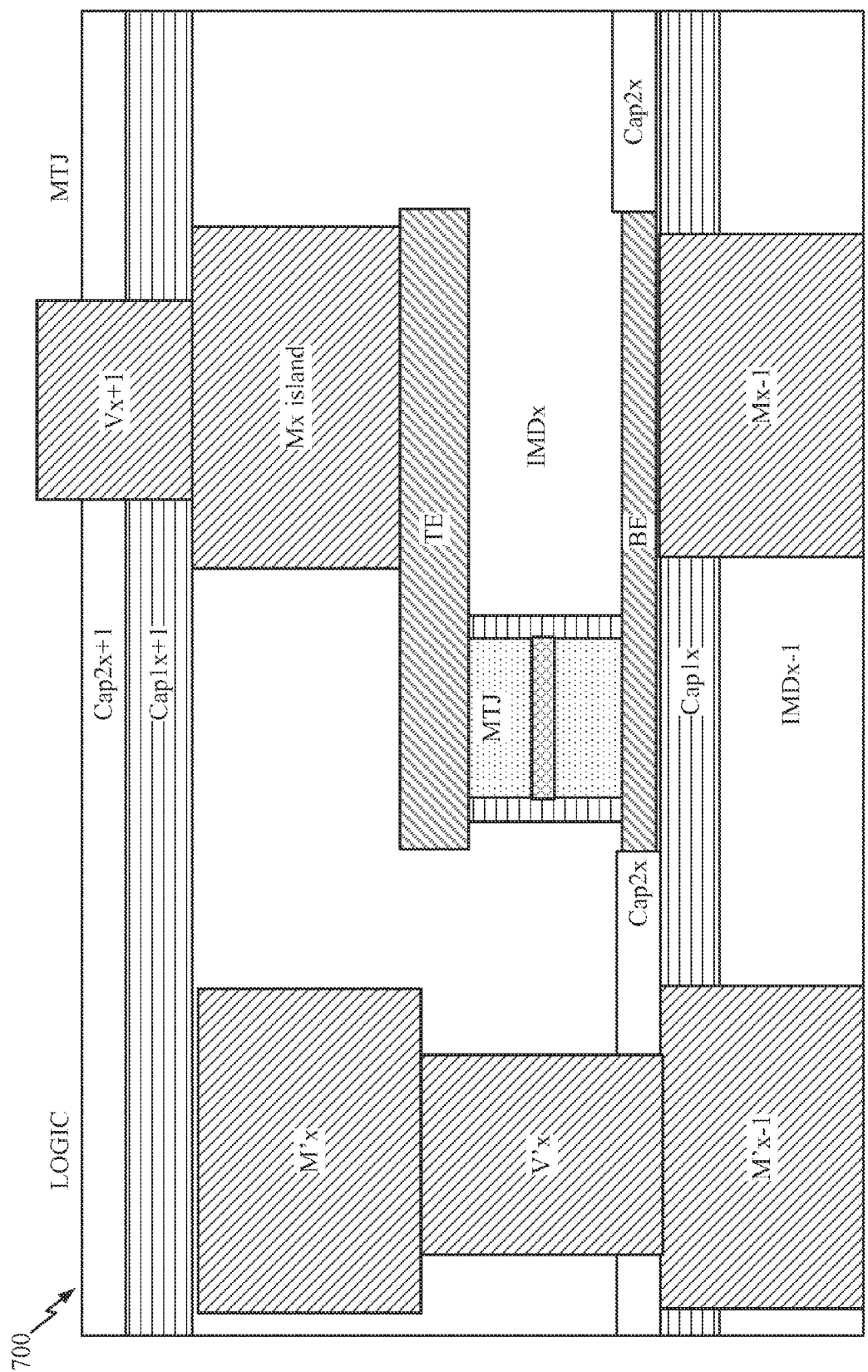
FIG. 7 illustrates yet another exemplary embodiment including MRAM cells integrated with logic.

However, in an alternative configuration, any detrimental impact due to the minimal thinning of Mx can be avoided using the configuration illustrated in FIG. 7. In embodiment 700, the metal wire Mx is reduced in thickness in layer x, and connected to metal Mx+1 (not shown) in layer x+1, through via Vx+1. Metal Mx+1 can be sized appropriately to be used as the new bit line, similar to embodiment 300. Accordingly, the recessed size of metal Mx does not affect the performance, because metal Mx+1 can be designed to carry the current load in layer x+1, while the reduction of Mx facilitates the integration of the MRAM cell in layer x. Additionally, similar to the embodiment of FIG. 3, it will be appreciated that metal wire Mx is used to facilitate a vertical conduction path which alleviates any negative impact due the thinning of Mx. Also, in this configuration, the metal wire Mx is isolated by top electrode TE, from the sidewalls and tunneling barrier layer and the danger of a short-circuit taking place is avoided.

Figure 8:
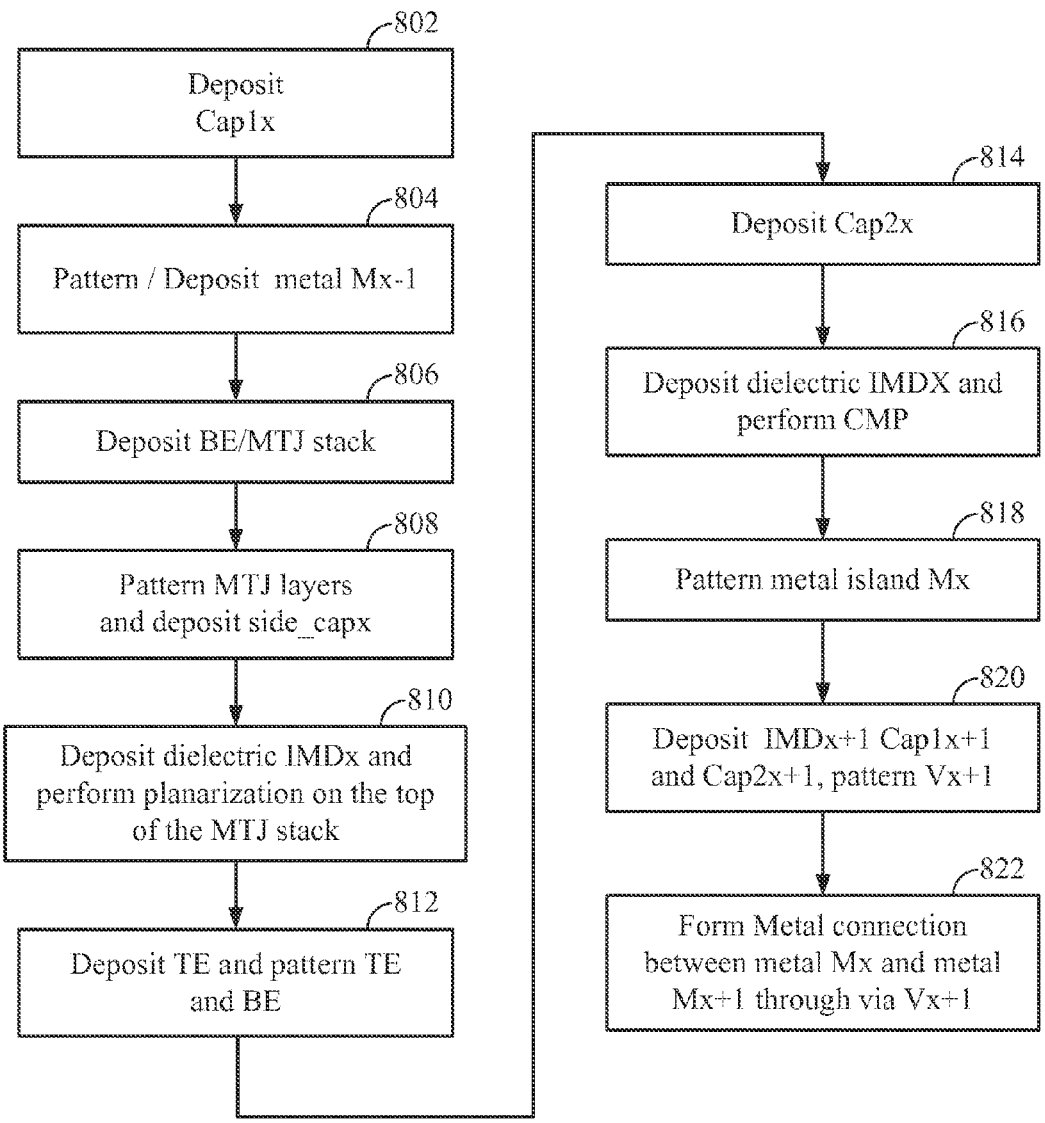
FIG. 8 details the process flow in forming a memory device including MRAM cells according to another exemplary embodiment.

The process flow for integration of MRAM cells integrated with logic according to embodiments 600 and 700 is illustrated in FIG. 8. At block 802, Cap1x is deposited on IMDx−1 layer. Metal wire Mx−1 in layer x−1 is patterned and deposited, in block 804. Next, the bottom electrode BE is deposited directly on top of Mx−1 followed by deposition of the MTJ stack, in block 806. Then, the MTJ stack is patterned and a sidewall cap Side_Capx is deposited in block 808. Inter-metal-dielectric IMDx is deposited in the regions between MRAM cells and other logic cells in layer x, at block 810, and a planarization process is performed on the top of the MTJ stack. Top electrode TE is deposited in block 812, and the top electrode TE is patterned. Cap layer Cap2x is then deposited as shown in FIGS. 6 and 7, embedding BE, in block 814. Next, in block 816, dielectric IMDx is deposited again, in order to fill any open regions of layer x, and a process of Chemical Mechanical Polishing (CMP) can be performed to for planarization. For the embodiment of FIG. 6, Mx and insulating cap layers in layer x+1, (Cap1x+1 and Cap2x+11) can be formed, as is well known. For the embodiment of FIG. 7, metal wire Mx is patterned and deposited, in block 818, to form a metal island. Insulating cap layers in layer x+1, (Cap1x+1 and Cap2x+1) and IMDx+1 are deposited in block 820, and patterned, in order to form via Vx+1. In block 822, metal Mx+1 is coupled to metal Mx through via Vx+1. Once again, it will be appreciated that the foregoing process sequences were described solely for illustration and not limitation of the various embodiments. Various sequences may be combined and/or the order rearranged to achieve the configurations illustrated and discussed in relation to FIGS. 6 and 7. Further, the corresponding operations for forming the logic elements have not been described, as they are well known in the art, and any compatible process may be used.

The embodiments disclosed herein overcome problems faced in conventional techniques of integrating MRAM cells with corresponding logic layers. Exemplary embodiments solve the problems of restrictive vertical space for the formation of MRAM cells; problems of overlap between metal wires and the MTJ stack; and potential short-circuits between metal wires and the MTJ stack.

From the foregoing description, it will be appreciated that the MRAM integration in some exemplary embodiments includes the formation of metal island from Mx and coupling Mx with another metal layer (e.g., Mx+1), as described in embodiment 300. This technique is fully compatible with conventional logic formation processes and requires no change to the formation of the logic elements. Alternate embodiments 600 and 700 include lowering the location of the MTJ stack in layer x, by forming BE directly on top of Mx−1 and altering the position of the bi-layer insulating caps Cap1x and Cap2x accordingly, as shown in FIGS. 6-7. Both embodiments 600 and 700 include a modification to the baseline logic formation process, where the position of bi-layer insulating caps (e.g., Cap1x and Cap2x) is altered. Embodiment 700 further includes the formation of metal island from Mx and coupling Mx with another metal layer (e.g., Mx+1), as in embodiment 300.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, algorithm, and/or process sequences described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

It will be appreciated that semiconductor devices including the MTJ storage elements described herein may be included within a mobile phone, portable computer, hand-held personal communication system (PCS) unit, portable data units such as a personal data assistant (PDA), GPS enabled device, navigation device, settop box, music player, video player, entertainment unit, fixed location data unit such as meter reading equipment, or any other device that stores or retrieves data or computer instructions, or any combination thereof. Accordingly, embodiments of the disclosure may be suitably employed in any device which includes active integrated circuitry including memory having MTJ storage elements as disclosed herein.

The foregoing disclosed devices and method can be designed and can be configured into GDSII and GERBER computer files, stored on a computer readable media. These files may in turn be provided to fabrication handlers who fabricate devices based on these files. The resulting products are semiconductor wafers that are then cut into semiconductor die and packaged into a semiconductor chip. The chips are then employed in devices described herein.

Accordingly, embodiments can include machine-readable media or computer-readable media embodying instructions which when executed by a processor transform the processor and any other cooperating elements into a machine for performing the functionalities described herein as provided for by the instructions.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A method of forming a semiconductor device comprising:
   forming a magnetic tunnel junction (MTJ) storage element in a common interlayer metal dielectric (IMD) layer with a logic element;
   forming a reduced thickness metal wire in the common IMD layer coupled to the MTJ storage element that is smaller in thickness then a corresponding metal wire of the logic element
   forming a top cap layer separating a top IMD layer from the common IMD layer;
   forming a bottom cap layer separating a bottom IMD layer from the common IMD layer;
   coupling a bottom electrode and a top electrode to the MTJ storage element;
   coupling a first metal wire in the bottom IMD layer to the bottom electrode; and
   coupling a second metal wire in the common IMD layer to the top electrode, wherein the second metal wire is the reduced thickness metal wire.

2. The method of claim 1, further comprising:
   forming the bottom electrode in the common IMD layer and coupling the bottom electrode to the first metal wire through a first via;
   forming the second metal wire as a metal island isolated from the MTJ storage element by the top electrode, and
   coupling the second metal wire to a third metal wire in the top IMD layer.

3. The method of claim 2, wherein the second metal wire is coupled to the third metal wire by a second via in the common IMD layer and a third via extending to the third metal wire.

4. The method of claim 1, further comprising:
   forming a portion of the bottom electrode in the bottom cap layer, such that the bottom electrode is coupled to the first metal wire by direct contact.

5. The method of claim 4, further comprising:
   forming the second metal wire as a metal island isolated from the MTJ storage element; and
   coupling the second metal wire to a third metal wire in the top IMD layer.

6. The method of claim 1, further comprising:
   forming a sidewall cap layer on sidewalls of the MTJ storage element.

7. The method of claim 1, wherein the semiconductor device is integrated into at least one semiconductor die.

8. The method of claim 1, wherein the semiconductor device is integrated into a device, selected from a group consisting of a settop box, music player, video player, entertainment unit, navigation device, communications device, personal digital assistant (PDA), fixed location data unit, and a computer.

9. A method of forming a semiconductor device comprising:
   step for forming a magnetic tunnel junction (MTJ) storage element in a common interlayer metal dielectric (IMD) layer with a logic element;
   step for forming a reduced thickness metal wire in the common IMD layer coupled to the MTJ storage element that is smaller in thickness then a corresponding metal wire of the logic element
   step for forming a top cap layer separating a top IMD layer from the common IMD layer;
   step for forming a bottom cap layer separating a bottom IMD layer from the common IMD layer;
   step for coupling a bottom electrode and a top electrode to the MTJ storage element;
   step for coupling a first metal wire in the bottom IMD layer to the bottom electrode; and
   step for coupling a second metal wire in the common IMD layer to the top electrode, wherein the second metal wire is the reduced thickness metal wire.

10. The method of claim 9, further comprising:
    step for forming the bottom electrode in the common IMD layer and coupling the bottom electrode to the first metal wire through a first via;
    step for forming the second metal wire as a metal island isolated from the MTJ storage element by the top electrode, and
    step for coupling the second metal wire to a third metal wire in the top IMD layer.

11. The method of claim 10, wherein the second metal wire is coupled to the third metal wire by a second via in the common IMD layer and a third via extending to the third metal wire.

12. The method of claim 9, further comprising:
    step for forming a portion of the bottom electrode in the bottom cap layer, such that the bottom electrode is coupled to the first metal wire by direct contact.

13. The method of claim 12, further comprising:
    step for forming the second metal wire as a metal island isolated from the MTJ storage element; and
    step for coupling the second metal wire to a third metal wire in the top IMD layer.

14. The method of claim 9, further comprising:
    step for forming a sidewall cap layer on sidewalls of the MTJ storage element.

15. The method of claim 9, wherein the semiconductor device is integrated into at least one semiconductor die.

16. The method of claim 9, wherein the semiconductor device is integrated into a device, selected from a group consisting of a settop box, music player, video player, entertainment unit, navigation device, communications device, personal digital assistant (PDA), fixed location data unit, and a computer.

17. A method of forming a semiconductor device comprising a magnetic tunnel junction (MTJ) storage element disposed in a common interlayer metal dielectric (IMD) layer with a logic element, the method comprising:
    depositing an MTJ storage element on a bottom electrode in the common IMD layer;
    patterning the MTJ storage element;
    depositing a sidewall cap layer on sidewalls of the MTJ storage element;
    depositing a top electrode on the MTJ storage element;
    patterning the top electrode and the bottom electrode;
    depositing a portion of the common IMD layer;
    depositing a second metal wire on the top electrode;
    patterning the second metal wire to form a metal island that is smaller than the top electrode;
    depositing another portion of the common IMD layer;
    depositing a second cap layer on the common IMD layer to separate the common IMD layer from a top IMD layer; and
    forming a third metal wire in the top IMD layer, wherein the third metal wire is coupled to the second metal wire.

18. The method of claim 17, further comprising:
    depositing a third cap layer on the top electrode, wherein the third cap layer is configured to substantially surround the second metal wire.

19. A method of forming a semiconductor device comprising a magnetic tunnel junction (MTJ) storage element disposed in a common interlayer metal dielectric (IMD) layer with a logic element, the method comprising:
- forming a first cap layer comprising a first portion and a second portion;
- patterning the second portion to form an opening for a bottom electrode;
- depositing the bottom electrode, such that the bottom electrode is in contact with a first metal wire in the first portion;
- depositing an MTJ storage element on the bottom electrode;
- depositing a sidewall cap layer on sidewalls of the MTJ storage element;
- depositing a top electrode on the MTJ storage element;
- depositing a second metal wire on the top electrode, wherein the second metal wire has reduced thickness in comparison to a corresponding metal wire of the logic element;
- depositing at least part of the common IMD layer; and
- depositing a second cap layer on the common IMD layer to separate the common IMD layer from a top IMD layer.

20. The method of claim 19, further comprising:
- patterning the second metal wire to form a metal island that is smaller than the top electrode; and
- forming a third metal wire in the top IMD layer, wherein the third metal wire is coupled to the second metal wire.

* * * * *